(12) United States Patent
Klebanoff et al.

(10) Patent No.: US 6,772,776 B2
(45) Date of Patent: Aug. 10, 2004

(54) APPARATUS FOR IN SITU CLEANING OF CARBON CONTAMINATED SURFACES

(75) Inventors: Leonard E. Klebanoff, Dublin, CA (US); Philip Grunow, Livermore, CA (US); Samuel Graham, Jr., Dublin, CA (US)

(73) Assignee: EUV LLC, Santa Clara, CA (US)

( * ) Notice: Subject to any disclaimer, the term of this patent is extended or adjusted under 35 U.S.C. 154(b) by 136 days.

(21) Appl. No.: 09/956,543

(22) Filed: Sep. 18, 2001

(65) Prior Publication Data

US 2003/0051739 A1 Mar. 20, 2003

(51) Int. Cl.$^7$ ............................. B08B 3/12; B08B 6/00
(52) U.S. Cl. ........................... 134/902; 134/1; 134/1.1; 250/492.21
(58) Field of Search ............................ 134/1, 1.1, 902; 250/492.21, 492.3

(56) References Cited

U.S. PATENT DOCUMENTS

| | | | |
|---|---|---|---|
| 4,976,764 A | 12/1990 | Fujino | |
| 5,236,672 A | 8/1993 | Nunez et al. | |
| 5,413,760 A | 5/1995 | Campbell et al. | |
| 5,554,854 A | * 9/1996 | Blake | 250/492.21 |
| 5,972,163 A | * 10/1999 | Haji | 156/345.54 |
| 6,031,598 A | 2/2000 | Tichenor et al. | |
| 6,192,897 B1 | 2/2001 | Klebanoff et al. | |
| 6,313,583 B1 | * 11/2001 | Arita et al. | 315/111.21 |

FOREIGN PATENT DOCUMENTS

WO      WO99/57607      11/1999

OTHER PUBLICATIONS

Dalton, R.H., "The Activation of Oxygen by Electron Impact", *JACS.*, vol. 51, 2366 (1929).

Claxton, K.T. et al., "Reactions of Carbon with Carbon dioxide Activated by Low Voltage Electrons", *Carbon*, vol. 1, pp. 495–501 (1964).

* cited by examiner

*Primary Examiner*—Zeinab El-Arini
(74) *Attorney, Agent, or Firm*—Fliesler Meyer LLP

(57) ABSTRACT

Activated gaseous species generated adjacent a carbon contaminated surface affords in-situ cleaning. A device for removing carbon contamination from a surface of the substrate includes (a) a housing defining a vacuum chamber in which the substrate is located; (b) a source of gaseous species; and (c) a source of electrons that are emitted to activate the gaseous species into activated gaseous species. The source of electrons preferably includes (i) a filament made of a material that generates thermionic electron emissions; (ii) a source of energy that is connected to the filament; and (iii) an electrode to which the emitted electrons are attracted. The device is particularly suited for photolithography systems with optic surfaces, e.g., mirrors, that are otherwise inaccessible unless the system is dismantled.

13 Claims, 3 Drawing Sheets

US 6,772,776 B2

APPARATUS FOR IN SITU CLEANING OF CARBON CONTAMINATED SURFACES

This invention was made with Government support under Contract No. DE-AC04-94AL85000 awarded by the U.S. Department of Energy to Sandia Corporation. The Government has certain rights to the invention.

FIELD OF THE INVENTION

This invention relates generally to an apparatus for cleaning surfaces and particularly for cleaning optics by electron-activated gas-phase species.

BACKGROUND OF THE INVENTION

The present state-of-the-art for Very Large Scale Integration ("VLSI") involves chips with circuitry built to design rules of 0.25 μm. Effort directed to further miniaturization takes the initial form of more fully utilizing the resolution capability of presently-used ultraviolet ("UV") delineating radiation. "Deep UV" (wavelength range of λ=0.3 μm to 0.1 μm), with techniques such as phase masking, off-axis illumination, and step-and-repeat may permit design rules (minimum feature or space dimension) of 0.18 μm or slightly smaller.

To achieve still smaller design rules, a different form of delineating radiation is required to avoid wavelength-related resolution limits. One research path is to utilize electron or other charged-particle radiation. Use of electromagnetic radiation for this purpose will require extreme ultraviolet (EUV) and x-ray wavelengths. Various EUV and x-ray radiation sources are under consideration. There include, for example, (1) the electron ring synchrotron, (2) laser plasma source, (3) discharge plasma source, and (4) pulsed capillary discharge source. Some of the current sources of EUV eject debris that tend to coat optics used in photolithography which ultimately reduces efficiency.

In the next-generation of Extreme Ultraviolet Lithography (EUVL), multi-layer based optics and masks will also be subject to carbon contamination. The carbon contamination arises from EUV or plasma-induced dissociation of hydrocarbons absorbed onto optical surfaces from the residual background environment. Although contamination may be minimized by cleaning the vacuum environment, the carbon cannot be entirely removed. Current methods of removing carbon from surfaces are mostly oxidative, in that reactive oxygen species are generated to gasify the carbon into volatile CO and $CO_2$ which can be pumped away.

One challenge in EUVL is that the optics will be buried under layers of surrounding hardware, such as mechanical frames and cabling, as well as mechanical devices used to perform and monitor the lithographic process. A state-of-the-art EUVL machine is described in Tichenor et al., U.S. Pat. No. 6,031,598. The obscuring structures in the machine make it very difficult to direct reactive species generated from the exterior at the tool periphery to the optics located in the interior of the machine. Reactive gas phase species that encounter solid objects can be quenched prior to reaching the optics needing cleaning. Therefore, the art is in need of techniques to generate reactive species inside the optic mounting assembly in a manner that limits adverse effects on the optic.

SUMMARY OF THE INVENTION

The present invention is based in part on the recognition that strategically positioning an apparatus that produces activated gaseous species adjacent a surface that is subject to carbon contamination permits in-situ cleaning of that surface. The invention is particularly suited for photolithography systems with optic surfaces, e.g., mirrors, that are otherwise inaccessible unless the system is dismantled.

In one embodiment, the invention is directed to device for in situ cleaning of a substrate surface that includes:

(a) a housing defining a vacuum chamber in which the substrate is located;

(b) a source of gaseous species; and (c) a source of electrons that are emitted to activate the gaseous species into activated gaseous species.

In another embodiment, the source of electrons includes:

(i) a filament made of a material that generates thermionic electron emissions;

(ii) a source of energy that is connected to the filament; and (iii) an electrode to which the emitted electrons are attracted.

DESCRIPTION OF PREFERRED EMBODIMENTS

It is known that low energy electrons (about 0–50 eV) can activate gas phase molecules to make them more reactive than their ground (or unexcited) state. For example, oxygen and carbon dioxide can be electron activated at pressures of about 50–400 mTorr to form reactive gas-phase species ($O_2^*$ and $CO_2^*$) which can be employed to gasify carbon in reactions that are represented as follows:

$$C + O_2^* = CO_2(g) \quad (1)$$

$$C + CO_2^* = 2CO(g) \quad (2)$$

The present invention generates electron-activated gas phase species such as $O_2^*$, $CO_2^*$ strategically inside the lithographic environment near the optics to remove carbon contaminants.

Figure 1A:
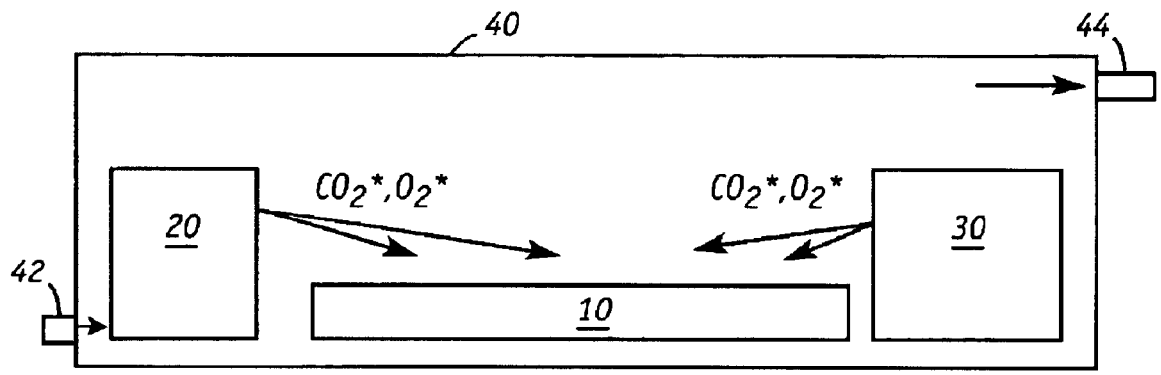
FIGS. 1A, 1B, and 2 illustrate cross-sectional views of two embodiments of the inventive apparatus for cleaning carbon contaminated surfaces.

FIG. 1A illustrates one embodiment of the invention for in-situ cleaning of a carbon contaminated optic 10 (e.g., mirror that reflects extreme ultraviolet radiation) that is situated within a vacuum chamber defined by housing 40 of a photolithography machine. Located on opposite sides of the mirror are gas activation devices 20 and 30 that generate electron-activated gas phase species. The vacuum chamber is connected to a gas inlet 42 and a gas outlet 44.

Figure 1B:
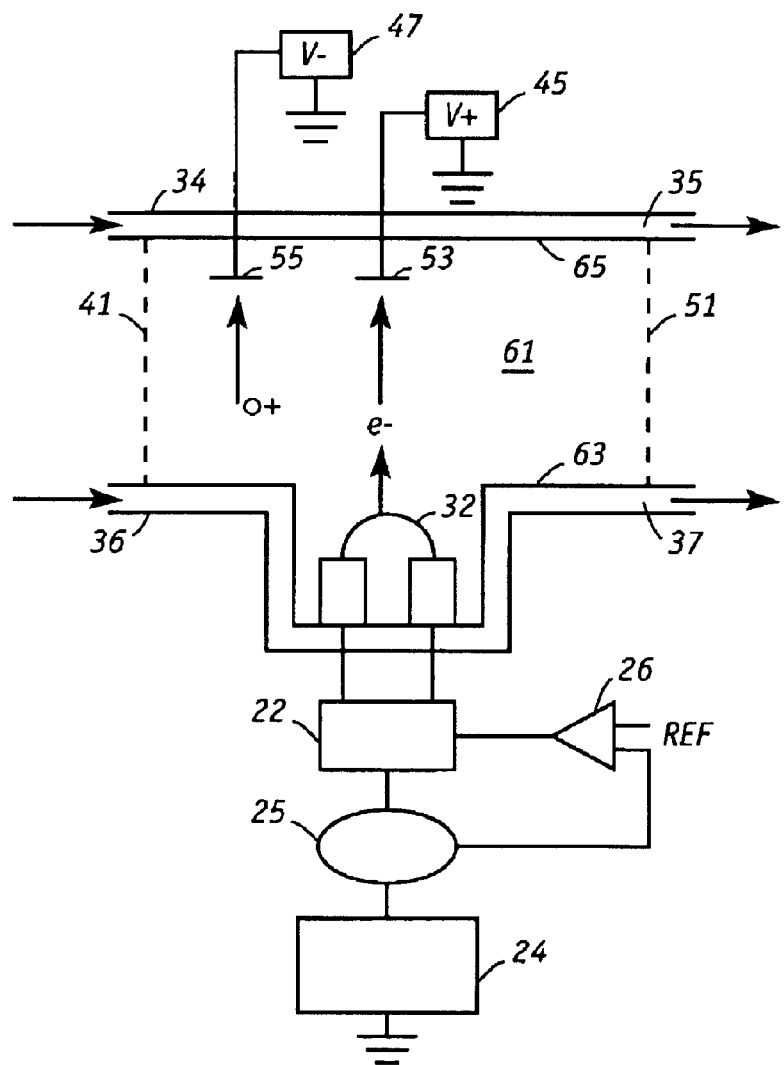

As illustrated in FIG. 1B, each device includes upper and lower wall 34,36 and grounded meshes 41,51 which collectively define the interior region 61. Each mesh has apertures or holes therein to allow gas to flow through. The interior surface of walls 63,65 facing interior region 61 are preferably coated with an infrared radiation (IR) absorbing material as black anodized aluminum. As depicted, the lower wall 36 preferably is configured to have a recessed area of sufficient depth such that filament 32 is situated below the upper surface 63 of the lower wall 36. Upper wall 34 and lower wall 36 are in thermal contact with coolant conduits 35 and 37, respectively. Situated within the interior region 61 are electrodes 53 and 55 which are connected to voltage source 45 and 47, respectively. The grounded meshes are preferably made of an electrically conductive material which preferably has a low emissivity. A preferred material is copper. The filament, which is connected to a dc or ac current source 22, is made from any suitable material that is capable of thermionic emission; preferred material is thoriated iridium.

In operation, the filament 32 is heated to the point of thermionic emission by the current source 22. The filament voltage, which is provided by an offset power supply 24 (filament offset), is typically set 10–50 volts more negative than the potential of electrode 53. As a result, electrons are accelerated from the filament towards electrode 53. Electrode 53 is typically at about −20 to +60 volts with respect to ground potential.

A gaseous species, such as, for example, $O_2$, $CO_2$, $N_2O$, $H_2O$, $H_2$ or a mixture thereof, is introduced into interior region 61 from gas source 42 (FIG. 1A) at a typical pressure of about 0.01 mTorr to about 1 Torr. The interior region is typically maintained at a pressure of between $10^{-6}$ Torr to 10 Torr and preferably between $10^{-3}$ Torr to $10^{-1}$ Torr. The low energy electrons from the filament will activate the gas phase species to form excited species $O_2^*$ and $CO_2^*$, for example, which will in turn flow toward the mirror surface and react with the carbon to form gaseous byproducts that can be readily removed, e.g., pumped through outlet 44.

As shown in FIG. 1B, the negatively charged electrode 55 which is positioned near grounded mesh 41 will attract any positively charged ions (created by the electron current) to effectively remove them from the activated gas stream. This will eliminate ion-induced damage to the optic. In addition, positioning the grounded mesh 41, 51 about the electrical assembly (filament, grid, and negative electrode) effectively creates a Faraday cage, which will contain the electric fields to the immediate region of the electrical assembly. As a result, the regions between the optic 10 and the devices 20, 30 are essentially free of electric fields. This further reduces the likelihood of electrostatic deposition of extraneous particles on the optic surface.

Heat can travel from the filament to the optic by three principle routes, all of which begin as emitted IR from the hot filament. First, the emitted IR can directly irradiate the optic. This is mitigated by placing the filament out of the line of sight of the optic, as shown in FIG. 1B. Second, the emitted IR can be reflected by the walls of the gas activation devices 20, 30 onto the optic. This is mitigated by placing an IR absorbing material on the interior of the wall of the devices. Finally, the emitted IR can be absorbed by the walls of the devices and as the walls heat up they in turn can emit IR. This is mitigated by using a temperature-controlled coolant, e.g., water, to cool the walls.

Reactions between the activated species and the filament may cause emission current instabilities. These instabilities may be detected by an ammeter 25 preferably connected between the current supply 22 and the filament offset 24. These instabilities can be eliminated by element 26 which adjusts the current through the filament to maintain a constant emission current. Regulation element 26 (which may be a differential amplifier) provides a feedback control signal to the current supply 22. Element 26 compares a reference signal with a signal related to the filament emission current and provides a stabilizing output, as is well known in the art.

While the device of FIGS. 1A and 1B includes two electron-activating gas phase species generating devices 20 and 30, it is understood that other configurations are contemplated. For example, a single device having a continuous filament and cylindrical radiation shield and anode that are situated around the perimeter of the mirror can be employed.

Figure 2:
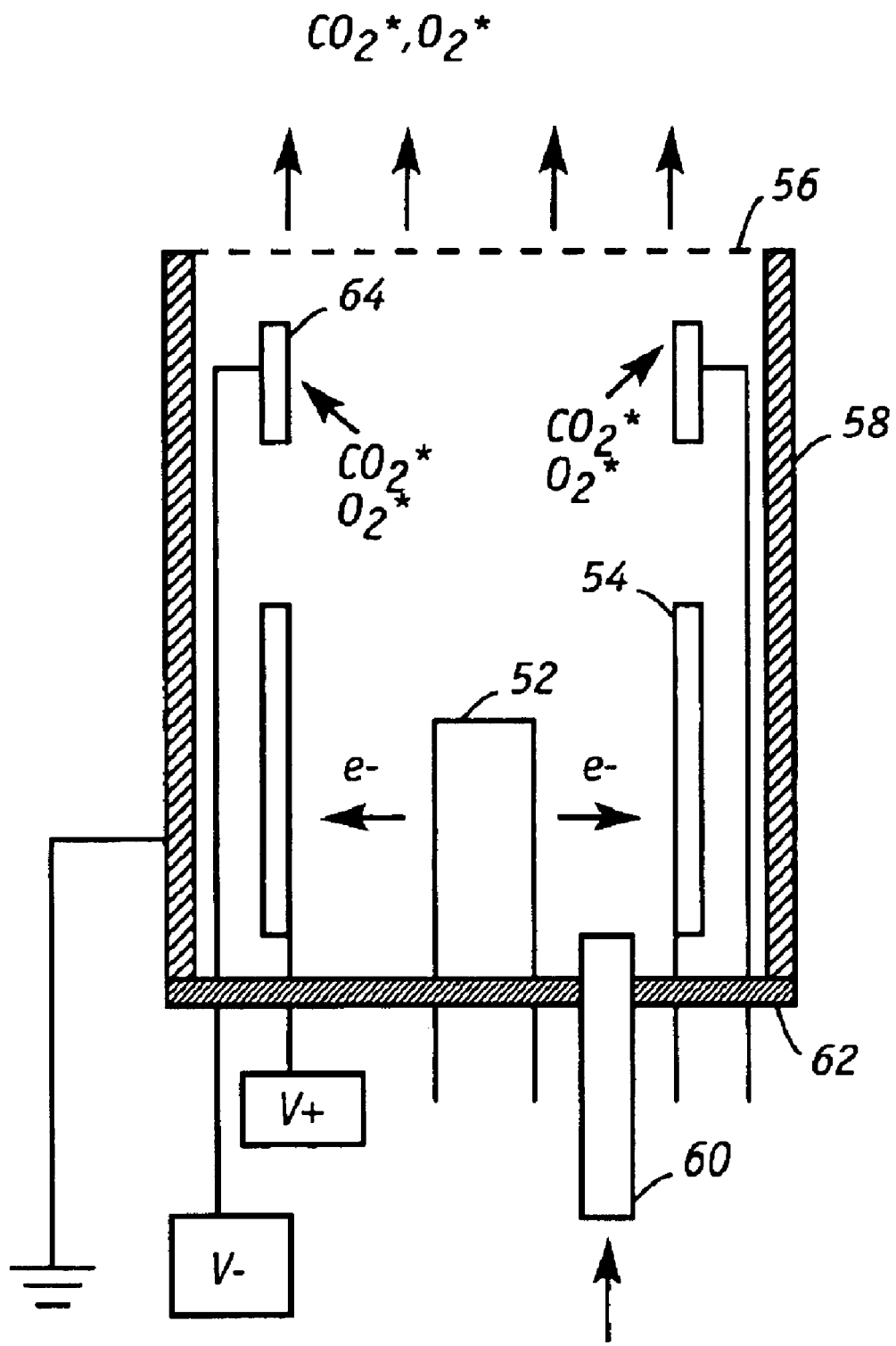

FIG. 2 illustrates another embodiment of an electron-activating device which includes (1) an electrically grounded radiation shield 58, (2) cylindrical tube 54, (3) filament 52 which is centered within a cylindrical tube 54, (4) screen 56, (5) gas inlet 60 and (6) base 62. The cylindrical tube functions as the anode. The same current source, voltage control, and emission current regulation set up shown in FIG. 1 can be employed. In operation, gas molecules from the inlet are activated by electrons that are generated by the filament as it is heated to the point of thermionic emission and accelerate to tube 54. The activated molecules flow to a mirror (not shown) through the screen 56 which also screens out electric fields which may be emanating from the filament. The screen could be any suitable configuration such as a plate with perforations or a grid. The radiation shield 58 serves as a heat shield and physical barrier. As an option, the device can include cathode 64 which prevents ions from passing through the screen and reaching the substrate (e.g., contaminated optics) being cleaned. This prevents the possibility of sputtering which can induce optic roughening.

Figure 3:
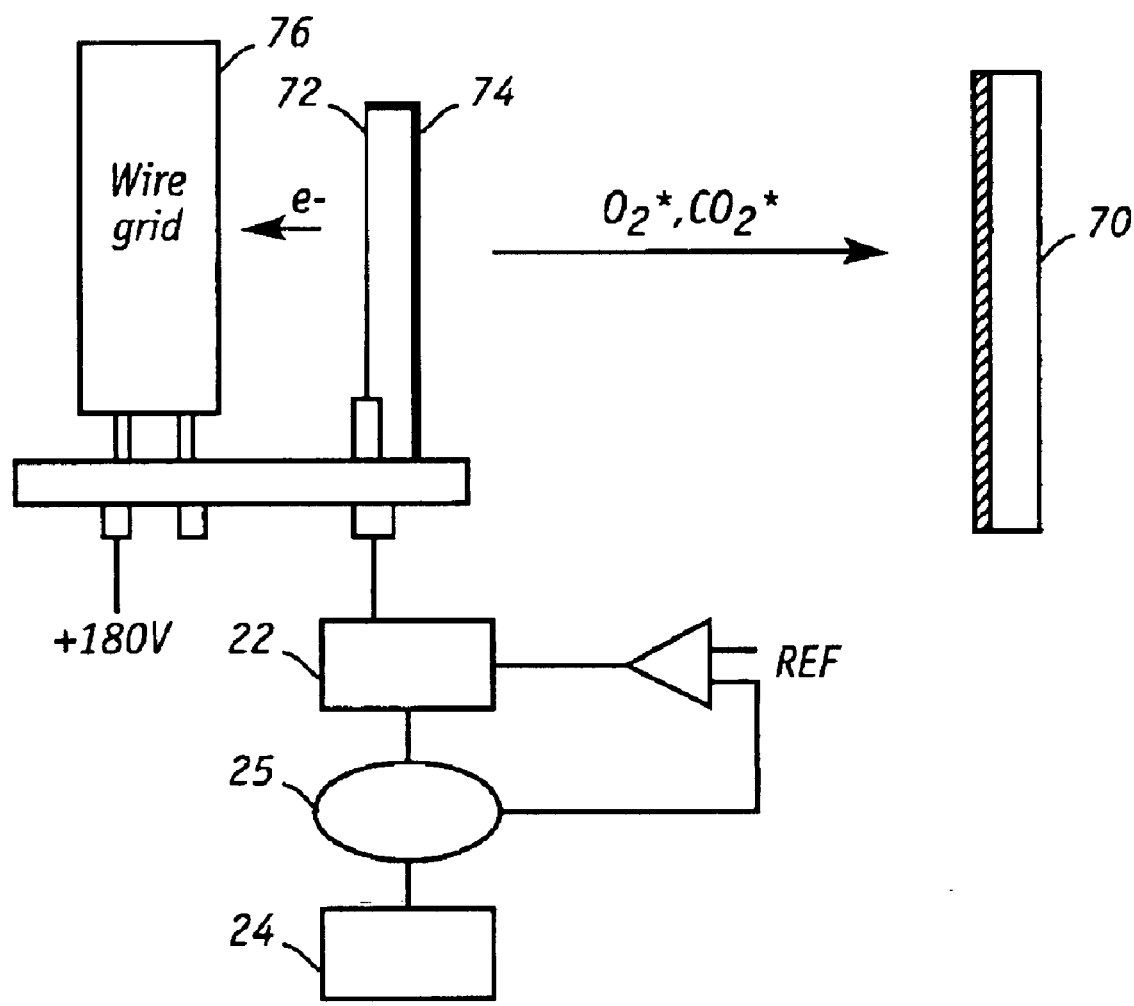
FIG. 3 shows the experimental arrangement used to study the removal of carbon from a substrate by activated gas phase species.

FIG. 3 illustrates the experimental design of the present invention that was used to assess carbon removal rate. Within a chamber, a photoresist coated silicon substrate 70 was placed 7 inches (17.8 cm) from filament 72 which was supported by member 74. A wire grid 76 that was maintained at a potential of 180 volts served as the anode. The filament voltage was controlled by the same electronic components as for the device of FIG. 1B except that the filament offset was set at +25 volts.

In one experiment, the chamber contained air at a pressure of 1 m Torr and the emission current was 1 mA and the electron energy was about 155 V. It was determined that the photo-resist was removed from the substrate at the rate of 5 angstrom/hr. It is believed that the activated oxygen in the chamber was the active agent. In another experiment using $CO_2$ pressure of 1 mTorr, the photoresist was removed at the rate of 3 angstrom/hr under the same electron emission conditions. Certain experiments demonstrated that electron activation of the gas phase species was responsible for carbon removal. Carbon removal was not due to the creation of an electrical discharge caused by two electrodes being at different potentials, or by evaporation of photoresist caused by simple heating. The cleaning required the electron activation of the gas phase species.

These experiments used somewhat high electron energies of order 155 V although lower energy electrons were studied as well and showed significant carbon removal. An advantage of this technique is that only low energy ($\leqq 50$ eV) excitation is used. Therefore, only low energy reactive species will be produced, minimizing any damage or sputter that might be caused to the optics by higher energy reactants.

Although only preferred embodiments of the invention are specifically disclosed and described above, it will be appreciated that many modifications and variations of the present invention are possible in light of the above teachings and within the purview of the appended claims without departing from the spirit and intended scope of the invention.

What is claimed is:

1. A device for in situ cleaning of a substrate, said device comprising:

(a) a housing defining a vacuum chamber in which a substrate that reflects extreme ultraviolet radiation is located;

(b) a source of gaseous species;

(c) a source of electrons that are emitted to activate the gaseous species into activated gaseous species for cleaning the substrate, the source of electrons comprising:

(i) at least one chamber, where the chamber having at least one side of a gas permeable material defines an interior region;

(ii) a filament positioned within the chamber, where the filament is connected to a source of energy;

(iii) at least one electrode positioned within the chamber, where the electrode is connected to a power supply; and (iv) means for removing heat from the chamber.

2. The device of claim 1 wherein the filament is made of material that generates thermionic electron emissions.

3. The device of claim 2 wherein the filament is made of thoriated iridium.

4. The device of claim 1 wherein the gas permeable material is electrically conductive.

5. The device of claim 1 wherein the interior region includes a recess region where the filament is positioned so that the substrate surface and the filament are not aligned along a direct line of sight of each other.

6. The device of claim 1 wherein the interior region comprises interior surfaces that are coated with a materiel that absorbs infrared radiation.

7. The device of claim 1 wherein one or more source of electrons are positioned along a perimeter of the substrate surface.

8. The device of claim 1 wherein the gaseous species are selected from the group consisting of $O_2$, $CO_2$, $N_2O$, $H_2O$, and $H_2$ or mixtures thereof.

9. The device of claim 8 further comprising an inlet through which the gaseous species is introduced into the vacuum chamber.

10. The device of claim 1 wherein the electrode has a cylindrical structure defining a cavity and an aperture that faces the surface and wherein the filament is situated within the cavity.

11. The device of claim 10 further comprising a grid that covers the aperture of the cylindrical structure.

12. The device of claim 1 wherein the vacuum chamber is maintained at a pressure of $10^{-6}$ Torr to 10 Torr with the gaseous species.

13. The device of claim 1 further comprising a cathode that prevents ions from reaching the substrate surface.

* * * * *